United States Patent
Dawson et al.

(10) Patent No.: US 7,483,283 B2
(45) Date of Patent: Jan. 27, 2009

(54) APPARATUS FOR EFFICIENT STREAMING DATA ACCESS ON RECONFIGURABLE HARDWARE AND METHOD FOR AUTOMATIC GENERATION THEREOF

(75) Inventors: Linda M. Dawson, Hoffman Estates, IL (US); Sek M. Chai, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 187 days.

(21) Appl. No.: 11/694,401

(22) Filed: Mar. 30, 2007

(65) Prior Publication Data

US 2008/0244169 A1    Oct. 2, 2008

(51) Int. Cl.
*G11C 15/00* (2006.01)
(52) U.S. Cl. ................. 365/49; 365/185.17; 365/230.05
(58) Field of Classification Search .................... 365/49, 365/185.17, 230.05, 185.29, 185.14, 189.01, 365/189.08; 711/108
See application file for complete search history.

(56) References Cited

U.S. PATENT DOCUMENTS

| | | | |
|---|---|---|---|
| 5,047,391 A | 9/1991 | Bock et al. | |
| 6,278,289 B1 | 8/2001 | Guccione et al. | |
| 6,351,143 B1 | 2/2002 | Guccione et al. | |
| 6,353,332 B1 * | 3/2002 | Brelet | 326/40 |
| 6,781,857 B1 | 8/2004 | Lien et al. | |
| 6,992,947 B1 * | 1/2006 | Pan et al. | 365/230.05 |

OTHER PUBLICATIONS

Arm, AMBA AXI Protocol Specification, V 1.0, Jun. 1, 2003.
Altera, Avalon Interface Specification, May 1, 2005.
Xilinx, Processor Local BUS (PLB), V 3.4, Jul. 7, 2003.
Doweck, Intel Smart Memory Access: Minimizing Latency on Intel Core Microarchitecture, Technology @ Intel Magazine, Sep. 2006.

* cited by examiner

*Primary Examiner*—Dang T Nguyen

(57) ABSTRACT

A content addressable memory (CAM) is disclosed that includes a memory having a first port configured to write a 1-bit data to the memory and a second port configured to read and write N-bit data. To update the CAM, an N-bit zero data word is written to the second port at a first address A2 to erase N bits of the memory at address A2, then the first address A2 is combined with a data value A0 to form a second address A1. Finally, a value 1 is written to the first data port at the address A1. Reading the second port at the first address A2 will produce an N-bit data word having value 1 at bit position A0 and zeros at all other bit positions. The CAM may be configured in reconfigurable hardware using random access memory and used in a stream data interface circuit.

16 Claims, 10 Drawing Sheets

APPARATUS FOR EFFICIENT STREAMING DATA ACCESS ON RECONFIGURABLE HARDWARE AND METHOD FOR AUTOMATIC GENERATION THEREOF

FIELD OF THE INVENTION

The present invention relates generally to the field of reconfigurable hardware, and in particular to the configuration of a content addressable memory unit.

BACKGROUND

Traditionally, integrated circuit processors are designed either as general purpose microprocessors, as application specific integrated circuits (ASIC's) or as reconfigurable logic circuits. The integrated circuit processors transfer data from memory through a tightly coupled memory interface. A general purpose microprocessor transfers data by following arbitrary sequences of microprocessor instructions defined by a user written program. This provides flexibility but decreases performance because the circuitry is not optimized for any specific application. An ASIC is designed by describing its structure in terms of circuit primitives such as Boolean gates and registers. The circuit designer arranges the circuit primitives so as to optimize performance for a specific application (such as video compression or audio decoding). While an ASIC provides high performance, its fixed architecture cannot be changed after fabrication to adapt to new algorithms or changing standards. Additionally, the high development costs and lengthy design cycle are not suited to rapidly developing markets.

Reconfigurable logic circuits (also known as programmable logic circuits) typically include user-configurable circuitry that is controlled by configuration data to implement a user's logic function. The user-configurable circuitry typically includes general-purpose logic resources (e.g., look-up tables), special-purpose logic resources (e.g., RAM circuits), and interconnect resources that are connected between the general-purpose and special purpose logic resources. To configure (or program) a circuit, a user typically enters a desired logic function into a Personal Computer (PC) or workstation that is configured to run one or more place-and-route software programs. These place-and-route software programs then generate a configuration solution by assigning portions of the logic function to specific logic resources of the circuit, and allocating sections of the interconnect resources to form signal paths between the logic resources, thereby causing the circuit to emulate the desired logic function. The configuration solution generated by the place-and-route software is then converted into a bit-stream that is transmitted into the configuration memory of the circuit.

Reconfigurable logic circuits may be used, for example, as hardware accelerators to perform computationally expensive data processing tasks. To enable fast computation, an efficient memory interface is required. The memory interface may also be implemented using reconfigurable logic. For example, for certain applications in which a large amount of ordered data (which is typically stored in a regular memory pattern such as a vector, a two-dimensional shape, or a link list) is to be accessed in memory or transferred in real-time from a peripheral, a streaming architecture may be used. Processing such ordered data streams is common in media applications, such as digital audio and video, and in data communication applications (such as data compression or decompression). In many applications, relatively little processing of each data item is required, but high computation rates are required because of the large amount of data. Processors and their associated memory interface are conventionally designed with complex circuits that attempt to dynamically predict the data access patterns and pre-fetch required data. This approach is typically limited in performance because data access patterns are difficult to predict correctly for many cases. In addition, the associated circuits consume power and chip area that can otherwise be allocated to actual data processing.

In general, data may be stored in non-contiguous memory locations. This complicates the task of memory access. For example, in image processing applications, a sub-tile from an image may occupy a non-contiguous region of memory. In this case, and in some other applications, the memory locations may be predictable from a small set of parameters via simple arithmetic calculations. In these cases, stream parameters (such SPAN, STRIDE, SKIP etc.), may be used in conjunction with custom logic circuits (fixed or reconfigurable) to generate consecutive memory addresses. However, implementation of a parameter-based streaming interface on a reconfigurable logic such as an FPGA utilizes a larger number of FPGA slices, and does not make efficient use of limited FPGA resources.

In other applications, it is possible to find a small set of parameters that describe the data memory locations. Some application specific integrated circuits (ASIC's) use a content addressable memory (CAM). In a CAM circuit, a data value is searched for by its content, rather than by its address. Data values are stored (pre-loaded) in CAM circuits such that each data value is assigned to a row or column of an array of CAM cells. To determine whether a particular data value is stored in the CAM circuit, a content-based data match operation is performed in which the searched-for data value is simultaneously compared with the rows/columns containing the pre-loaded data values. When one or more of the pre-loaded data values match the searched-for data value, a "match" signal is generated by the CAM circuit, along with an address indicating the storage location (i.e., row or column) of the pre-loaded data value. By simultaneously comparing the searched-for data value with several pre-loaded data values, a CAM circuit is able to perform compare-and-match (hereafter "match") operations involving several pre-loaded data values in a single clock cycle. Therefore, when compared with RAM circuits, CAM circuits significantly reduce the search time needed to locate a particular data value from a large number of data values.

Early reconfigurable logic circuits did not support on-chip CAM functions, and external dedicated CAM circuits were required. These dedicated CAM circuits were connected to the input/output (I/O) terminals of the circuit, and CAM functions were performed in conjunction with circuit operations by transmitting information between the programmable logic device (PLD) and the dedicated CAM circuit. A problem with this arrangement is that it results in relatively slow operation speeds, and requires the use of precious reconfigurable logic circuit's I/O resources that typically limits the complexity of other logic functions implemented in the reconfigurable logic circuit. Therefore, there is a demand for reconfigurable logic circuits that perform on-chip CAM functions in order to speed up CAM operations and free-up reconfigurable logic circuits I/O resources.

More recently, advanced reconfigurable logic circuits have been produced with dedicated CAM circuits that provide on-chip CAM functions. A problem with including dedicated CAM circuitry in a reconfigurable logic circuit is that the CAM circuitry is essentially useless unless a user's logic function implements a CAM function. That is, unlike general-purpose logic circuitry, dedicated conventional CAM circuitry typically cannot be used for non-CAM logic functions. Therefore, the dedicated CAM circuitry remains idle when a user's logic function does not include a CAM function, and takes up die space on the device that could otherwise be used for logic operations.

Another problem with including dedicated CAM circuitry in a reconfigurable logic circuit is the conflict between the amount of die space required for the CAM circuitry and the range of CAM functions that can be implemented by the CAM circuitry (i.e., the flexibility of the CAM circuitry). A relatively simple CAM circuit requires relatively little die space, but is less likely to support a wide range of CAM functions (i.e., has little flexibility). On the other hand, a sophisticated CAM circuit is more likely to support a wide range of CAM functions, but requires a large amount of die space, thereby reducing the number of general-purpose logic resources provided on the PLD. Therefore, a device manufacturer must balance the flexibility of the CAM circuit with the amount of die space occupied by the CAM circuitry. Typically, such choices result in CAM features that are less than optimal.

Static CAM device, such as those used on ASIC's, are not suitable for use in reconfigurable logic circuits, since they do not allow dynamic reprogramming.

Reconfigurable logic circuits often include random access memory (RAM) or block random access memory (BRAM). Techniques for using the dual-port block RAM in reconfigurable devices to implement CAM functions have been disclosed. However, these techniques are not optimized for dynamic content update, which is required for dynamic out-of-order access (DOOA).

BRIEF DESCRIPTION OF THE FIGURES

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
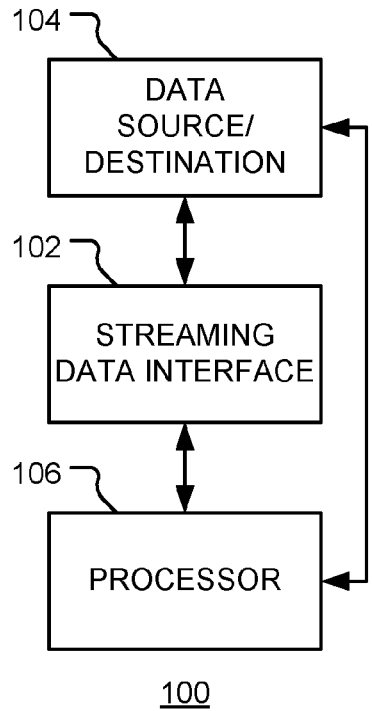
FIG. 1 is a block diagram of an exemplary processing system incorporating a streaming data interface in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to efficient streaming data access on reconfigurable logic. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may comprise one or more conventional processors and unique stored program instructions that control the one or more processors to implement, in conjunction with certain non-processor circuits, some, most, or all of the functions of configuring efficient streaming data access on reconfigurable logic described herein. The non-processor circuits may include, but are not limited to, a radio receiver, a radio transmitter, signal drivers, clock circuits, power source circuits, and user input devices. As such, these functions may be interpreted as a method to generate efficient streaming data access configurations on reconfigurable logic. Thus, methods and means for these functions have been described herein.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Some embodiments of the present invention relate to a dynamically programmable content addressable memory (CAM) circuit and a method for automatic generation of a configuration of a dynamically programmable CAM. The CAM circuit is dynamically programmable in that a bit or slice of data previously stored in the CAM can be erased, thereby allowing new data to be written to the same address.

Figure 2:
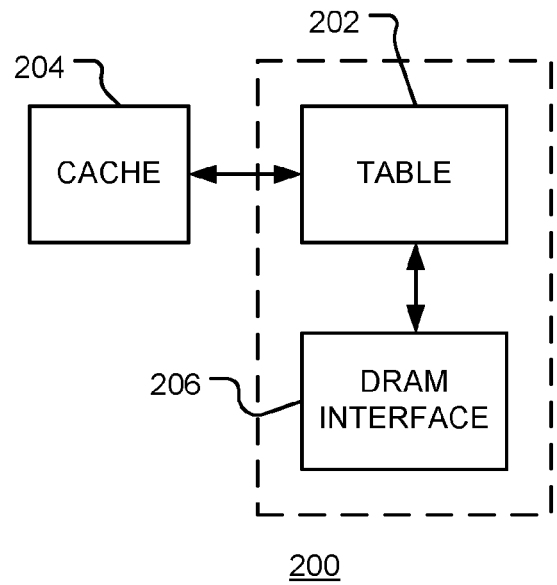
FIG. 2 is a block diagram of an exemplary caching memory system including a memory address table in accordance with some embodiments of the invention.
Figure 3:
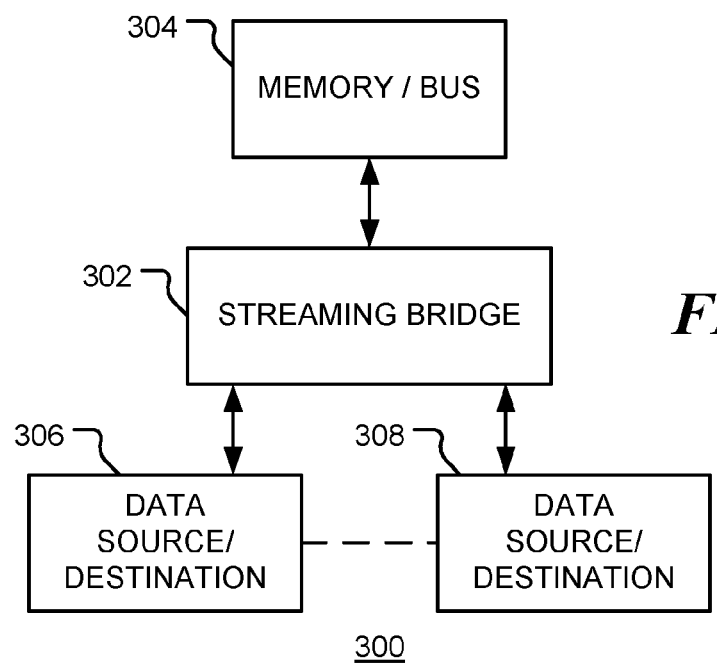
FIG. 3 is a block diagram of an exemplary system incorporating a streaming data bridge in accordance with some embodiments of the invention.

A dynamically programmable CAM has many applications, some of which are illustrated in FIGS. 1-3.

FIG. 1 is a block diagram of an exemplary processing system 100 incorporating a streaming data interface in accordance with some embodiments of the invention. The processing system 100 includes a streaming data interface (SDIF) 102 that is operable to generate data locations (such as memory addresses) and transfer data between a data source or destination 104 and a processor 106. In this system, generation of memory addresses in SDIF 102 is separated from the processing of the data in the processor 106. This may be achieved by using input and output streaming data interface devices. An input streaming data interface device is a circuit that may be programmed to calculate memory addresses for a data stream. In operation, an input streaming data interface device (alternatively called an input streaming data interface circuit) retrieves data items from a memory, or some other device having certain memory characteristics, in a specified order and presents them consecutively to the memory or other device, such as a processor, served by the input streaming data circuit. Similarly, an output streaming data interface circuit receives consecutive data items from a memory or other device and stores them in a specified data pattern in a memory or transfers them within a data stream to some other device.

Some embodiments of the present invention may be generally described as ones in which the streaming data interface (SDIF) circuit 102 includes a content addressable memory (CAM). The streaming data interface (SDIF) circuit 102, consisting of input and output streaming data devices, may be determined by an automation tool that takes as inputs circuit parameters that define the system hardware and stream descriptors that define locations of data streams which are needed for processor operations. The circuit parameters characterize the abilities of the different memory buffers and bus links in memory or other device having memory characteristics, while the stream descriptors define the location of target data in memory storage or in a data stream that is being transferred. Streaming data consists of many target data that may be spread throughout the memory storage in complex arrangements and locations. Using this set of information, the automation tool may generate an optimized streaming data interface that is tightly coupled to a processor or hardware accelerator for a more efficient transfer of required data.

A dynamically reprogrammable CAM may be used for dynamic out-of-order access (DOOA) in a memory controller as shown in FIG. 2. FIG. 2 is a block diagram of an exemplary caching memory system 200 including a memory address table 202 in accordance with some embodiments of the invention. The memory address table 202 incorporates a dynamically reprogrammable CAM. The memory address table 202 is operable to dynamically determine order of access between a memory cache 204 and a random access memory (DRAM) interface 206. The memory address table 202 operates to associate local memory addresses to memory address in a DRAM.

FIG. 3 is a block diagram of an exemplary data transfer system 300 incorporating a streaming data bridge 302. A streaming data bridge 302 may incorporate one or more streaming data interfaces (SDIF) 102. In accordance with some embodiments of the invention, the streaming data bridge 302 includes a dynamically programmable CAM. The streaming data bridge 302 is operable to transfer data between a memory or bus 304 and one more data sources or destinations (306 and 308 for example). The streaming data bridge 302 may dynamically determine the order of access among the sources and destinations in order to provide the most efficient (in terms of bandwidth, power, and latency) transfer of data.

Operation of an exemplary dynamically programmable CAM for use in streaming data interface will now be described. However, it is to be understood that the present invention is not limited to streaming data interfaces and may be used in any application where a CAM would reduce circuit size and/or increase performance.

Figure 4:
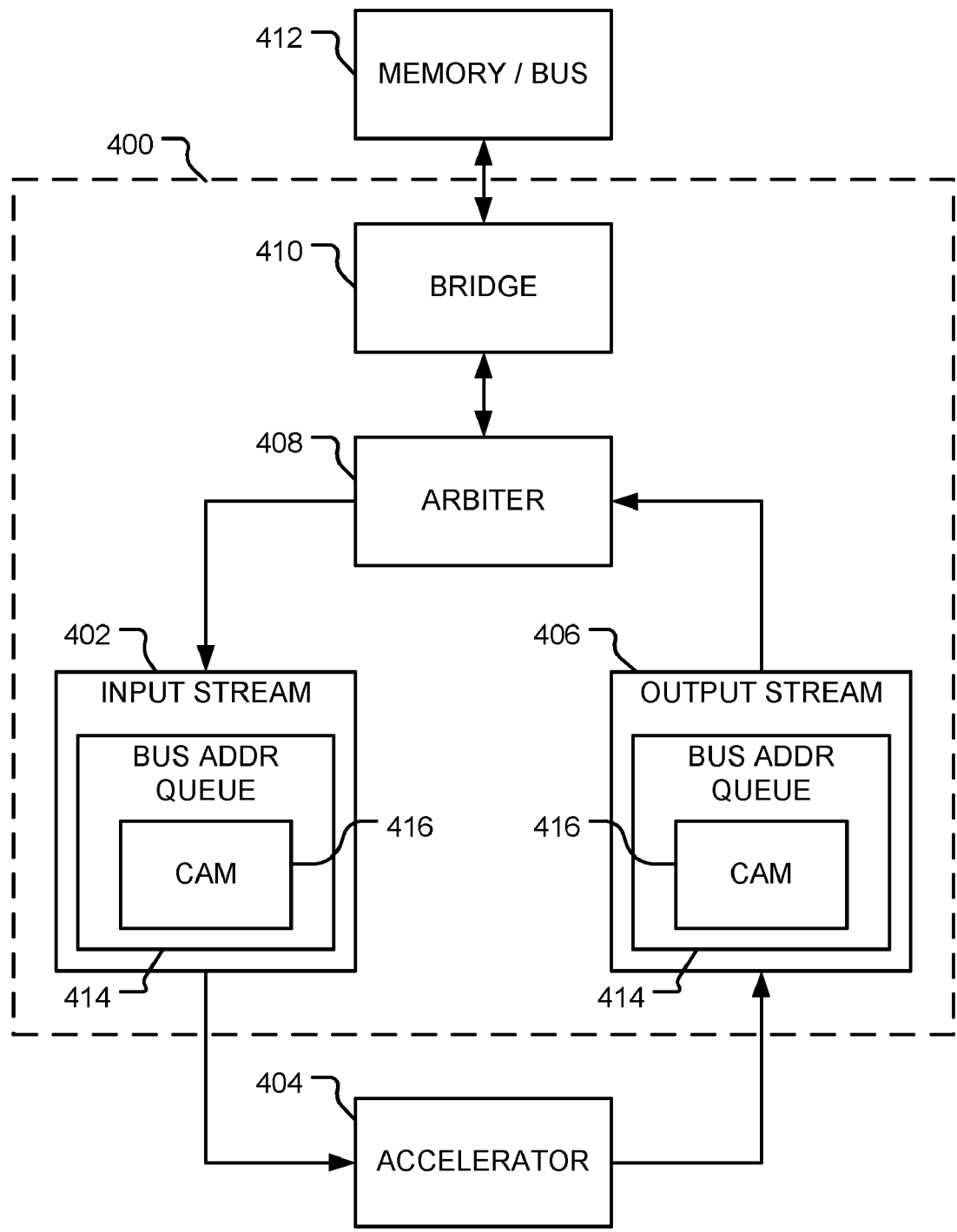
FIG. 4 is a block diagram of an exemplary streaming data interface in accordance with some embodiments of the invention.

FIG. 4 is a block diagram of a system for streaming data access in accordance with some embodiments of the invention. Referring to FIG. 4, the streaming data interface 400 includes an input stream device 402, which passes data to an accelerator 404, and an output stream device 406 that receives data from the accelerator 404. Both the input stream device 402 and the output stream device 406 are coupled through an arbiter 408 and a bridge 410 to a data bus 412.

The input and output stream devices 402 and 406 each contain a bus address queue 414. The streaming memory interface (SDIF) prefetches data from external memory by generating addresses based on stream descriptors (such as START_ADDRESS, STRIDE, SPAN, SKIP and TYPE). These addresses are stored in the bus address queue 414. In turn, the bus address queues each incorporate a reconfigurable CAM 416. The CAM is dynamically programmable, which allows the input and output stream devices to be used for both ordered memory access and dynamic out-of-order access (DOOA). In particular, if the data bus 402 supports dynamic out-of-order access (DOOA), data provided by the processor bus to the SDIF may not be in the same order as the bus address queue. A CAM unit 416 can be used to match the data provided by the processor bus. The processor bus provides bus transaction tags that can be matched with contents of the CAM unit.

The use of a bus address queue supports data prefetching for both input and output data streams. In some embodiments, the CAM is configured in a field programmable gate array (FPGA) and makes efficient use of the FPGA's distributed resources, such as random access memories (RAM's) and look up tables (LUT's).

Figure 5:
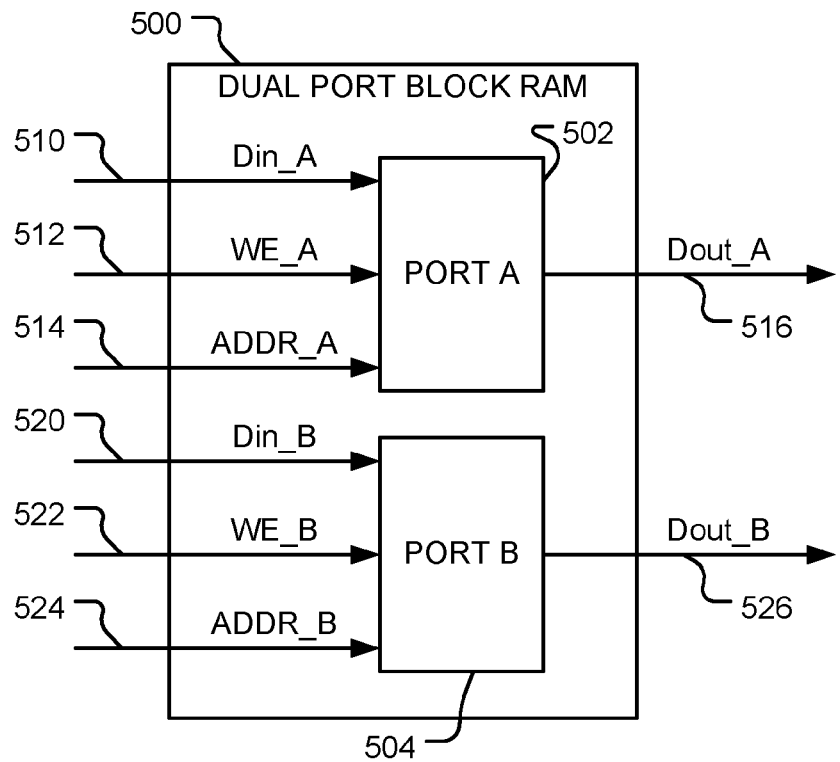
FIG. 5 is a block diagram of a dual port block random access memory (RAM).

FIG. 5 is a block diagram of a dual port RAM block 500. Such memory blocks are available in FPGA's along with reconfigurable logic to build more complex memory structures such as a CAM, which in turn can be used in a system's memory subsystem such as stream memory interface. The dual Port RAM has two access ports, Port A 502 and Port B 504, which allow reconfigurable logic to read and write to memory contents simultaneously. To access memory contents, data is presented to the data input of Port A (Din_A) 510 or the data input of Port B (Din_B) 520, and memory address is presented to the address input of Port A (ADDR_A) 514 or the address input of Port B (ADDR_B) 524. When the write enable input of Port A (WE_A) 512 or Port B (WE_B) 522 is active, data is written to the corresponding memory address. When a write enable input WE_A 512 or WE_B 522 is not active, data is read at the corresponding memory addresses, ADDR_A 514 or ADDR_B 524, and presented at the data outputs Dout_A 516 or Dout_B 526, respectively.

When the dual port RAM block 500 is used to build a CAM, the memory contents are used to store a match vector, such that a search word can be used as an address to access the match vector in the memory.

Figure 6:
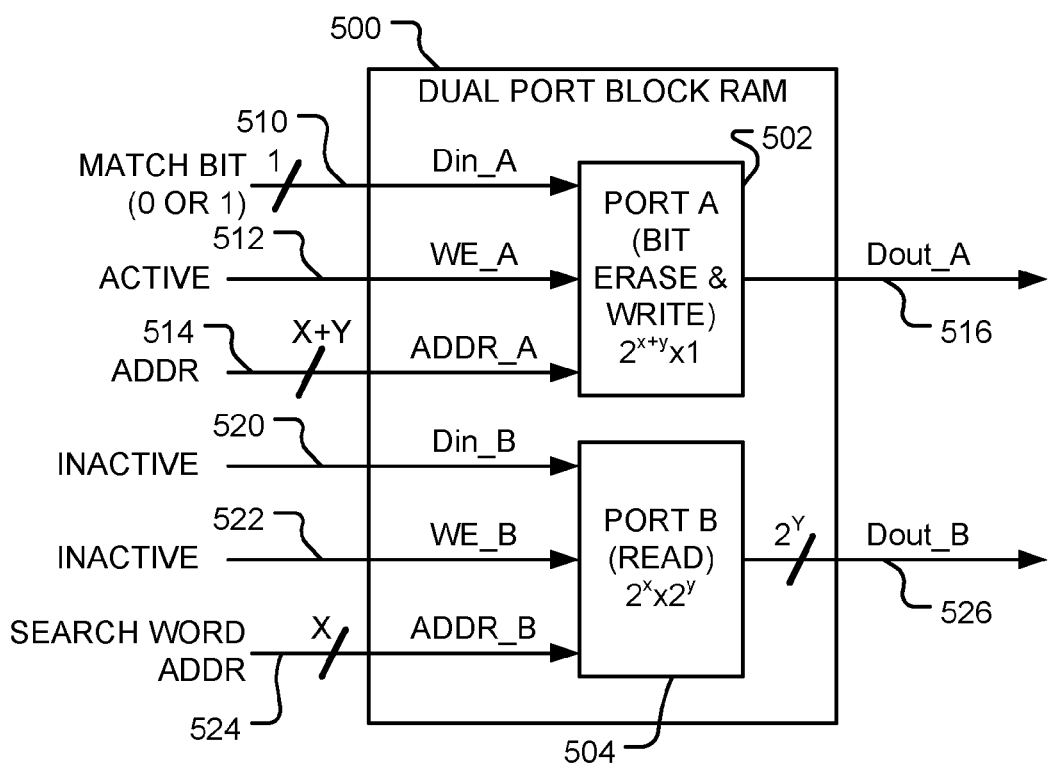
FIG. 6 is a block diagram of a dual port block (RAM) configured for use in a content addressable memory (CAM) in accordance with the prior art.

FIG. 6 is a block diagram of a dual port block RAM configured as a CAM in accordance with the prior art. Port A (502) is configured for 1-bit data and (X+Y)-bit addressing. Port B (504) is configured for $2^Y$-bit data and X-bit addressing. The dual port block RAM 500 is utilized such that Port A (502) is used to both erase and write new match vector, while Port B is used to search the contents of memory. The data input Din_A (510), is connected to match vector and ADDR_A (514) is connected to the search word address. The write enable input WE_A (512) is always active to either erase the memory contents or to write the match vector into memory. The address input ADDR_B (524) is connected to search word address to read memory contents to determine the match vector stored in memory. The inputs Din_B (520) and WE_B (522) are not active so that Port B (504) is used as a read port. In such a configuration, Port B (504) is used only to read CAM contents while Port A (502) is used to erase and update CAM contents. In normal CAM operation, data in the CAM at address A0 is updated using the following multi-cycle procedure: (1) the data at address A0 is retrieved from output Dout_B (526) using Port B (502), (2) the location of a '1' bit in the retrieved data word is found: this location is denoted by A1, (3) an address (A0:A1) for Port A is determined from the address A0 and the bit position A1, (4) a zero is written to Port A at address (A0:A1), (4) a second address (A0,B1) is determined, where B1 is the location of the bit to be written, and (5) Port A is used to write a '1' to the address (A0:B1). Thus a match vector read is required to determine which bit to erase One aspect of the present invention relates to a method for updating a content addressable memory (CAM) that includes a memory having a first port configured to write a 1-bit data to the memory and a second port configured to access the memory to read and write N-bit data, where N is greater than one. To update the CAM, an N-bit zero data word is written to the second port at a first address A2 to erase N bits of the memory at address A2, then the first address A2 is combined with a data value A0 to form a second address A1. Finally, a value 1 is written to the first data port at the address A1, to set one bit of memory at the second address A1. Reading the second port at the first address A2 will produce an N-bit data word having value 1 at bit position A0 and zeros at all other bit positions.

In one embodiment, the bit position A0 is a Y-bit value and $N=2^Y$. The first port is configured to store 1-bit data at up to $2^{X+Y}$ locations addressed by an (X+Y)-bit address and the second port is configured to store $2^Y$-bit data at up to $2^X$ locations addressed by an X-bit address.

Figure 7:
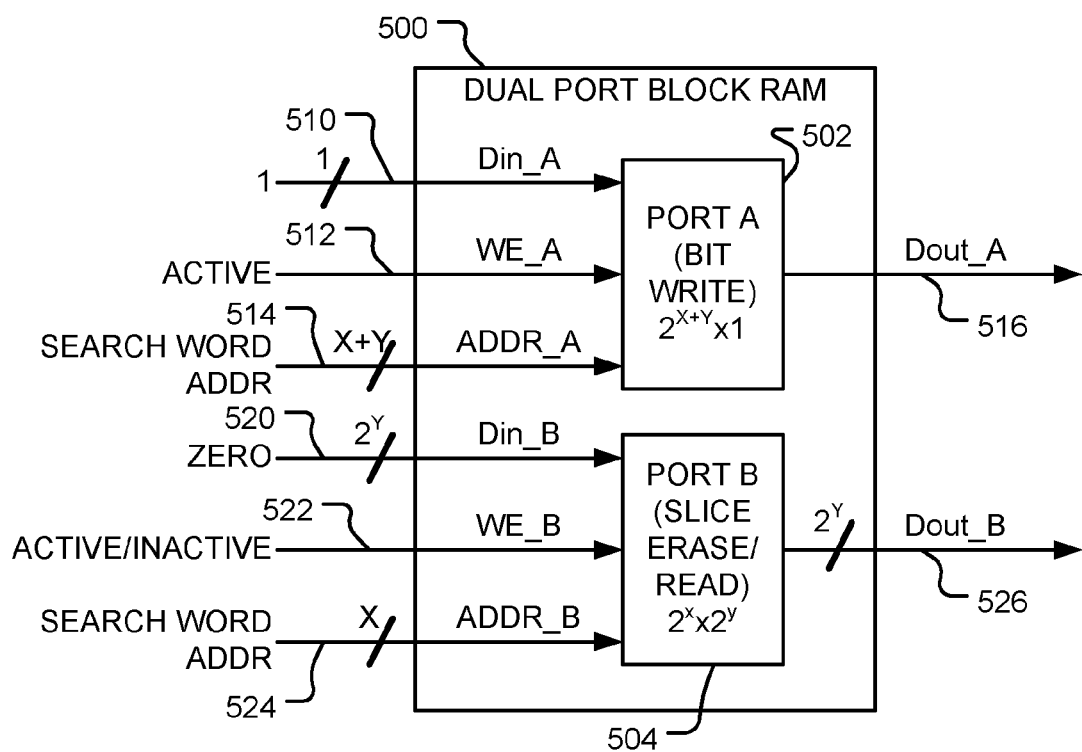
FIG. 7 is a block diagram of a dual port block (RAM) configured for use in a content addressable memory (CAM) in accordance with some embodiments of the invention.

FIG. 7 is a block of a dual port block RAM configured as a CAM in accordance with an embodiment of the present invention. Port A (502) is configured for 1-bit data and (X+Y)-bit addressing. Port B (504) is configured for $2^Y$-bit data and X-bit addressing. Both ports are used for writing such that the CAM update procedure can be completed in a smaller number of clock cycles. The dual port block RAM 500 is utilized such that Port A (502) is used to write new match vector, while Port B (504) is used to erase contents of memory. In normal CAM operation, the following two-cycle procedure: a Port B erase followed by a Port A write is necessary to update CAM contents. In contrast to prior techniques, a read (match) operation is not required to determine which bit to erase, since all bits in the memory slice are erased in a single write operation. Both ports in the dual port block RAM are used for writing such that the CAM update procedure can be completed in a smaller number of clock cycles.

Figure 8:
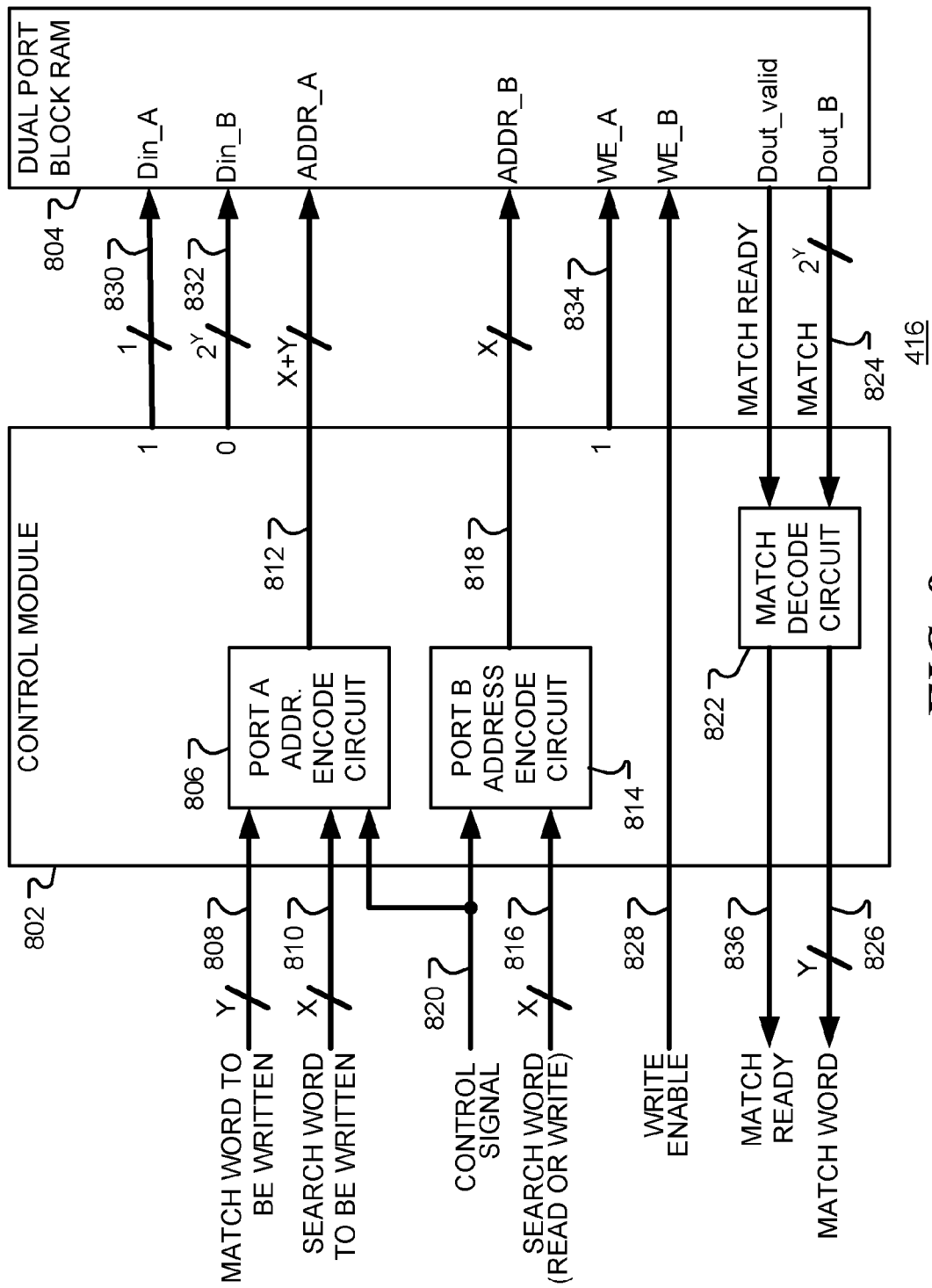
FIG. 8 is a block diagram of a content addressable memory (CAM) in accordance with some embodiments of the invention.

FIG. 8 is a block diagram of a content addressable memory (CAM) in accordance with some embodiments of the invention. The CAM 416 comprises a control module 802 and a dual port block RAM 804. The control module 802 may be implemented in reconfigurable logic.

When the CAM is used with a stream data interface (SDIF), as shown in FIG. 4, SDIF prefetches data from external memory by generating addresses based on stream descriptors (START_ADDRESS, STRIDE, SPAN, SKIP, TYPE). These addresses are stored in the bus address queue (414 in FIG. 4). If the processor bus supports DOOA, data provided by the processor bus to SDIF may not be in the same order as the bus address queue. A CAM unit using dual port block RAM 804 can be used to match the data provided by the processor bus. The processor bus that supports DOOA will provide bus transaction tags that can be matched with the contents of the CAM unit.

Referring to FIG. 8, the Write Port A Address Encode circuit 806 encodes the match words 808 and search words 810 to be written to the memory 804. For example, an X-bit bus transaction tag (the search word) and an associated Y-bit address (the match word) may be encoded as an (X+Y)-bit RAM address 812 that specifies where a 'one' is to be written in the memory. The Port B Address Encode circuit 814 encodes X-bit search words 816, such as bus transaction tags, as an X-bit address 818 for searching or for match word erasing. An external control signal 820 may be used to control the Port A Address Encode circuit 806 and the Port B Address Encode circuit 814. A Match Encode circuit 822 converts a match vector 824 read from the RAM 804 into a Y-bit match word 826 that corresponds to the search word. For example, the match word may be the address associated with a bus transaction tag.

Since Port B is used for both reading and writing, a write enable signal 828 is coupled to the write enable input of port B.

In the embodiment in FIG. 8, the data written to Port A is single '1' bit 830, while the data written to port B is always zero 832, since Port B is used for erasing. Port A is only used for writing, so the write enable signal 834 is asserted (set to 1).

When the CAM is searched, a match ready signal 836 may be generated, indicating that the match word 826 is available and valid.

The width and depth of the dual port block RAMs are dependent on the width of the search words. For example, when the search word is a bus transaction tag, the width is related to the number of outstanding memory accesses. For example, four bits is required for a processor bus with 16 outstanding memory accesses.

Figure 9:
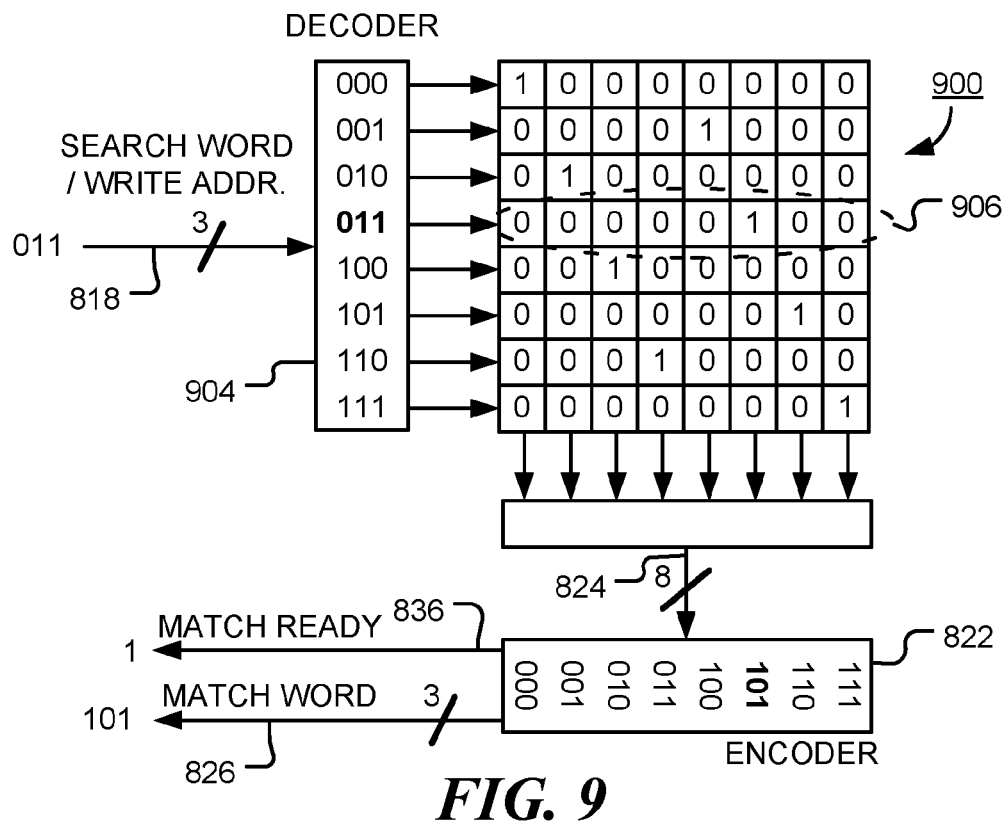
FIG. 9 is a diagrammatic representation of a CAM match operation in accordance with some embodiments of the invention.

FIG. 9 is an exemplary memory block of a CAM configured for performing a search. In this example the memory block 900 comprises an 8×8 array of memory locations. Each row of the memory stores a match vector. In this example, each match vector has either a single bit set or no bits set. In operation, 3-bit comparison data 818 is presented to a row decoder 904 of Port B that selects which row (or slice) of the memory is to be read. The contents 906 of the row are output from Port B as an 8-bit word 824. If a bit is set, the match vector 824 may be encoded by encoder 822 as a 3-bit match word 826 and the match ready output 836 is asserted. If no bit is set, the match ready output 836 is de-asserted. In this example, the search word is 011 and the match word is 00000100, which is encoded as 101.

Figure 10:
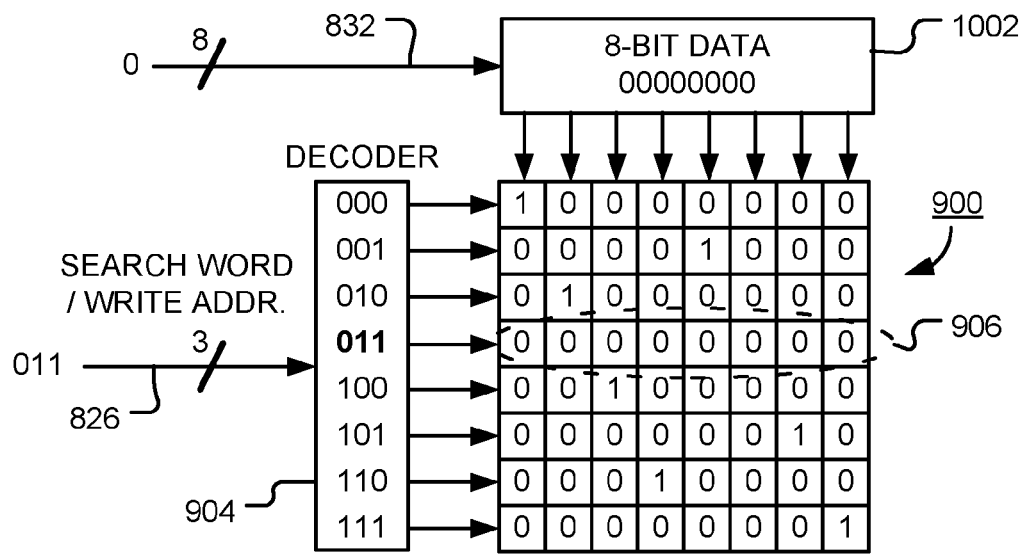
FIG. 10 is a diagrammatic representation of a CAM slice erase operation in accordance with some embodiments of the invention.

FIG. 10 is an exemplary memory block of a CAM configured for performing a slice or row erase. An 8-bit data word 832, with value 00000000, is written to data input (Din_B) 1002 of Port B of the RAM. A 3-bit search address 818 (the address of the slice or row to be erased) is passed to Port B address input. As a result, the row 906 is erased. In this example the row with address 011 is erased. In contrast to prior methods, no search is required to determine the position of the '1' in the row, since all bit positions are erased by the operation.

Figure 11:
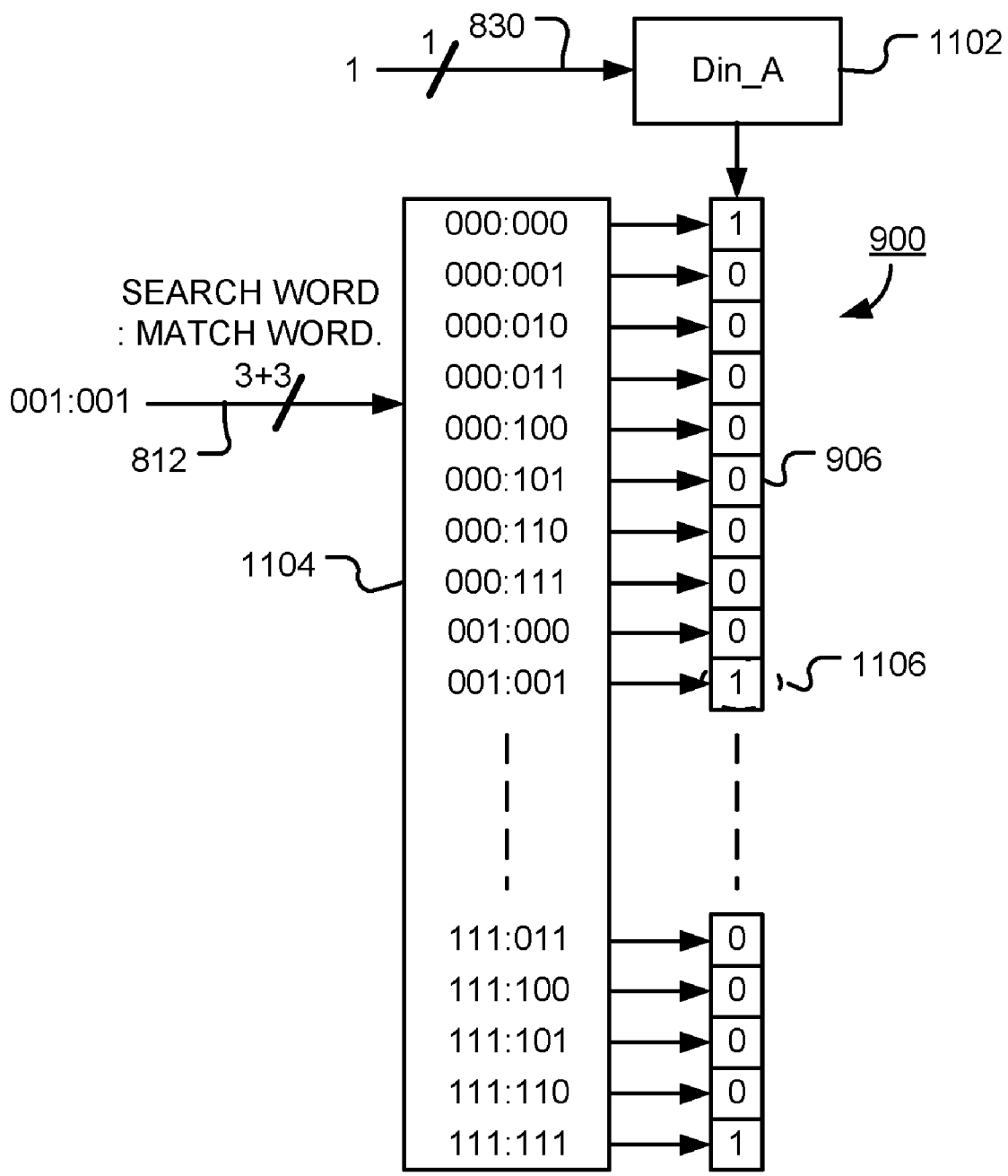
FIG. 11 is a diagrammatic representation of a CAM write operation in accordance with some embodiments of the invention.

FIG. 11 is an exemplary memory block of a CAM configured for performing a write operation using Port A of the RAM. Port A is configured for 1-bit data at 64 ($2^6$) locations. This represents a difference in the way the memory is addressed. However, the memory itself is the same memory as in FIGS. 9 and 10 described above. The configuration allows a '1' to be written to a memory location as specified by a 6-bit address. The 1-bit data 830 is written to the data input 1102 of Port A, and the 6-bit address 812 is written to the address input of Port A. In this example, the first three bits of the address denote the row number of the original 8×8 array and the last three bits indicate the bit-position (column) number of the original 8×8 array. The address is decoded by decoder 1104 to determine the memory location to be written. In this example the 6-bit address is 001001 so the value '1' is written to the location 1106.

In accordance with some embodiments of the invention, the memory block of the CAM may be implemented using multiple block RAM's. This approach is useful, for example, when the block RAM's available on a reconfigurable processor have a size that not sufficient for the number of search words required or the number of match words to be stored.

In one embodiment, the width of the memory (the number of columns) is increased adding one or more additional memory blocks. In this embodiment, N bits of the CAM at the first address A2 are erased using the second port by selecting at least two sub-blocks of memory of the plurality of sub-blocks dependent upon the address A2, selecting an address in the least two selected sub-blocks of memory dependent upon the address A2, and writing zero (of the appropriate number of bits) to each of the least two selected sub-blocks at the selected address.

Further, the first port is used to write a value 1 to the CAM at the address A1 by selecting at a sub-block of memory of the plurality of sub-blocks dependent upon the address A1 and the data value A0, selecting an address in the selected sub-block of memory dependent upon the address A1 and the data value A0, and writing a value 1 to the selected sub-block at the selected address.

The CAM may be searched by selecting at least two sub-blocks of memory of the plurality of sub-blocks dependent upon the address A2, selecting an address in the selected sub-block of memory dependent upon the address A2 and reading the at least two selected sub-block of memory at the selected address to obtain at least two intermediate words. Finally, the intermediate words are combined to form an N-bit data word.

In a further embodiment the depth for the memory (the number of rows) is increased by adding one or more memory blocks.

Figure 12:
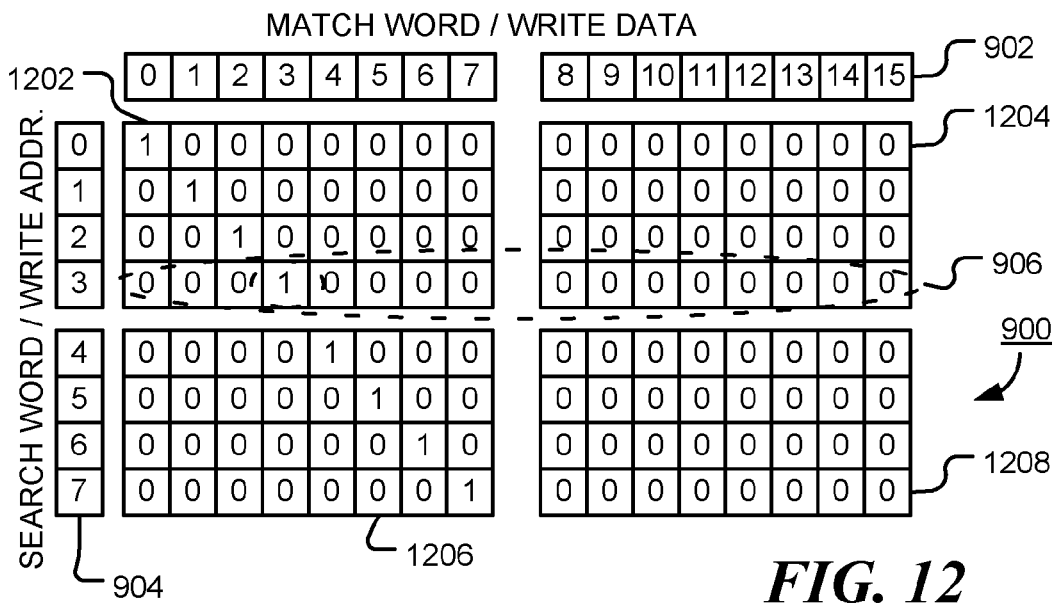
FIGS. 12 and 13 is diagrammatic representations of an exemplary RAM partition in accordance with some embodiments of the invention.

In the exemplary embodiment shown in FIG. 12, the memory block 900 with 8 rows and 16 columns has four sub-blocks, 1202, 1204, 1206 and 1208. Each memory sub-block may be implemented using a separate block RAM as shown in FIG. 13.

Figure 13:
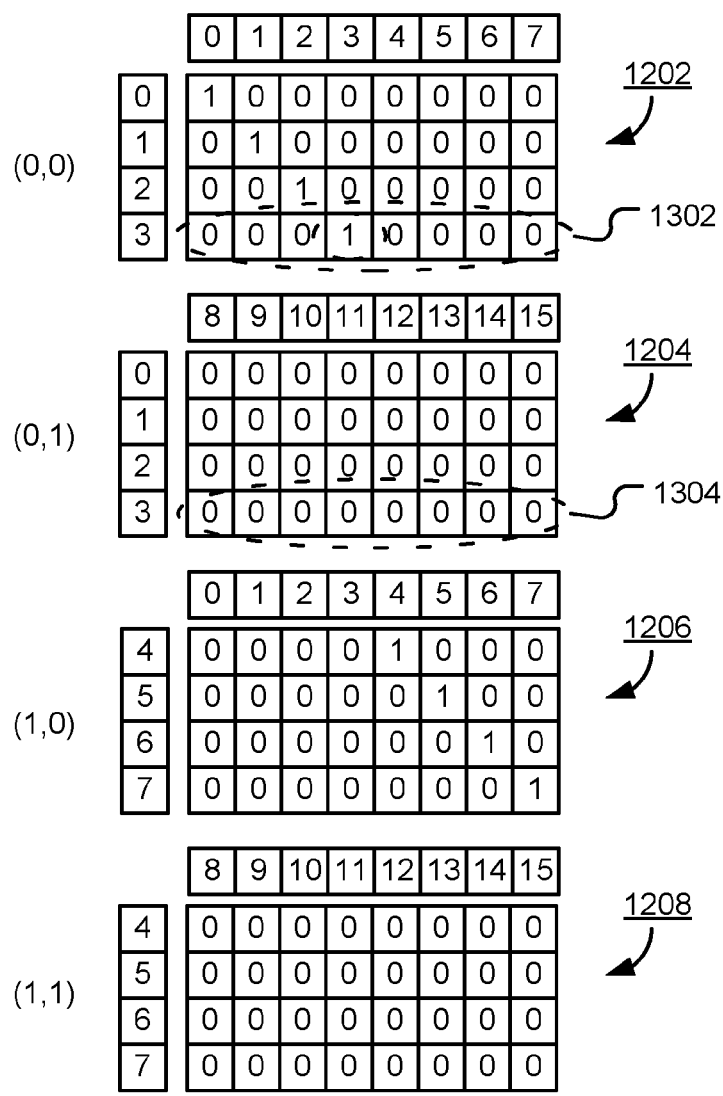

Referring to FIG. 13, each block RAM 1202, 1204, 1206 and 1208 has 4 rows and 8 columns. The original memory block was addressed by a 3-bit row address and a 4-bit column address. Each sub-block is addressed by a 2-bit row address and a 3-bit column address. In addition, a 2-bit address is used to specify which of the sub-blocks is to be addressed. In one embodiment, the location in the 8×16 array with row address (r2,r1,r0) and column address (c3,c2,c1,c0) is addressed as the element in row (r1,r0) and column (c2,c1,c0) in block (r2,c3). Thus, for example the location in row 3, column 3 of FIG. 12, has row address 011 and column address 0011, which is found in row 11 and column 011 of block (0,0).

Erasing a complete row of the complete 8×16 array, requires erasing rows in two sub-blocks. For example, erasing row 3 (906 in FIG. 12) requires that row 3 (1302 in FIG. 13) of block (0,0) by erased and also row 3 (1304 in FIG. 13) of block (0,1).

To write a match bit to address (r2,r1,r0:c3,c2,c1,c0) using Port A of the RAM, a '1' is written to address (r1,r0:c2,c1,c0) of block (r2,c3). Thus, for example, to set the bit in row 3, column 3 (address (011:0011) of Port A), a '1' is written to address (11:011) of block (0,0).

Figure 14:
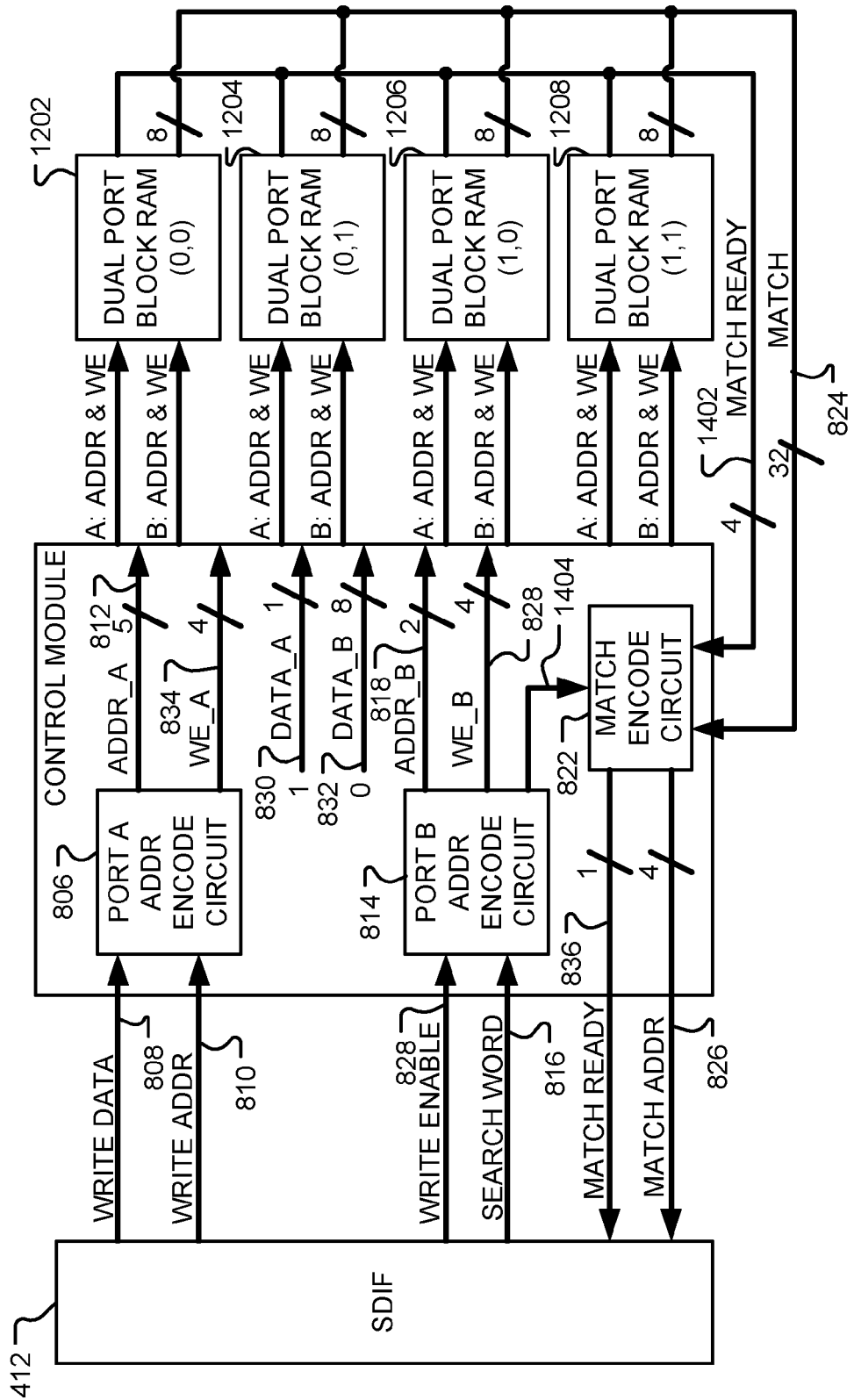
FIG. 14 is a block diagram of a CAM using multiple block RAM's in accordance with some embodiments of the invention.

FIG. 14 is a block diagram of a CAM using multiple block RAM's in accordance with some embodiments of the invention. In this example, the CAM utilizes a control module 802 and four blocks of dual-port memory, 1202, 1204, 1206 and 1208. In this example, each memory block has 32 elements. Port A is configured for a 5-bit address and 1-bit data while Port B is configured for a 2-bit address and 8-bit data.

To write new match data to the memory, the search word 816 and a write enable signal 828 are input to the Port B address encode circuit 814. In response, Port B address encode circuit 814 generates an address 818 and an asserted write enable signal 828. Since each memory block has four rows, the address 818 is a 2-bit address, and, since there are four memory blocks, the write enable signal 828 has four bits. The write enable signal selects the two memory blocks for which a row of data is to be erased by writing an 8-bit zero (832) to the data inputs of Port B. Alternatively, since a pair of memory blocks is erased, a 2-bit write enable signal may be used. The other two memory banks are not write-enabled. Next the search word (the address to be written) 810 and the match word (the data to be written) 808 are input to the Port A address encode circuit 806. The Port A address encode circuit 806 generates a 5-bit address 812 (since each memory block has 32 cells) and a 4-bit write-enable signal 834. The write-enable signal 834 indicates which one of the four memory block is to store the data. The data itself is a logical '1', 830. It will be apparent to those of ordinary skill in the art that the same configuration may also be used to write a logical zero to a location (i.e. to erase a single bit of the memory) is so desired.

To retrieve match data from the memory, the search word 816 and a de-asserted write enable signal 828 are input to the Port B address encode circuit 814. In response, Port B address encode circuit 814 generates an address 818 and a write enable signal 828. When match data is being retrieved, all four bits of the write enable signal 828 are de-asserted to enable reading of the memory. Each memory block returns the 8-bits of data stored at the address 818. These signals are combined as a 32-bit match signal 824. A signal 1404 is generated by the Port B address encode circuit 814 to indicate which pair of memory blocks are to be read. This signal is passed to the match encode circuit 822 the 16-bit part of the 32-bit match signal 824 from the selected blocks and encodes it as a 4-bit match address. Alternatively, the select 16-bit match word may be output.

Optionally, each memory block may generate a match ready signal that indicates if a non-zero bit found in the selected row of the memory. The match ready signals from the four memory blocks are combined as the 4-bit match 1402. The match encode circuit 822 determines if a match was found in the two selected memory blocks and asserts or de-asserts the output match ready signal 836 accordingly.

It will be apparent to those of ordinary skill in the art that other circuit arrangements that enable the erasure of a complete row or slice of memory may be used without departing from the present invention. The CAM may be implemented using a configurable or reconfigurable logic circuit.

It will also be apparent to those of ordinary skill in the art that the roles of Port A and Port B may be interchanged.

It will also be apparent to those of ordinary skill in the art that the values '0' and '1' are used to denote the logical values 'true' and 'false'. However, the method may be implemented using positive or negative logic.

A further aspect of the present invention relates to a method for automatic configuration of a stream data interface (SDIF) for a memory bus having width Y-bits and a bus queue of length $M \leq 2^X$ in a reconfigurable logic circuit having a dual port memory configurable in widths. In accordance with an embodiment of the method, a first port of the dual port memory is configured in the reconfigurable logic circuit for writing data of width one at addresses of width X+Y and a second port of the dual port memory is configured for both reading and writing data of width N-bits at addresses of width X-bits, where N is greater than or equal to the number of memory locations to be accessed over the memory bus and $N \leq 2^Y$. In addition, a first control module circuit is configured in the reconfigurable logic circuit to be operable to combine an address of width Y-bits with an X-bit memory bus access tag value to produce an address of width (X+Y)-bits for the first port of the dual port memory, and a second control module circuit is configured to be operable to write an N-bit zero value to the second port of the memory at an X-bit address specified by a memory bus access tag value. The second control module circuit is also configured to be operable to read the second port of the memory at an X-bit address specified by a memory bus access tag value.

A match encode circuit may also be configured in the reconfigurable logic circuit to be operable to receive an N-bit value from the second port of the dual port memory and to generate a Y-bit address dependent upon the N-bit value.

Figure 15:
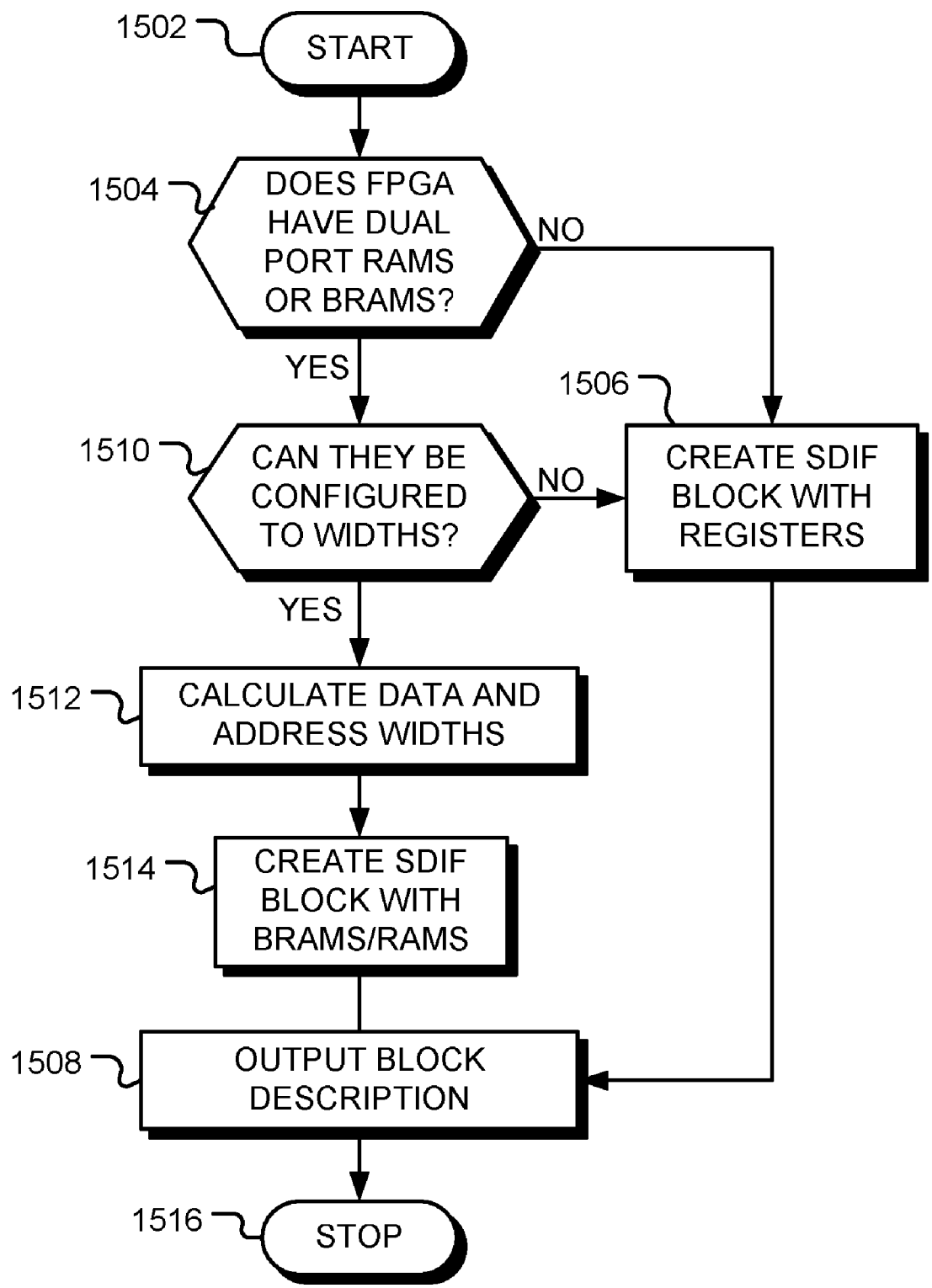
FIG. 15 is a flow chart of a method for automatic configuration of a CAM in a reconfigurable device in accordance with some embodiments of the invention.

FIG. 15 is a flow chart of a method for automatic configuration of a CAM in a reconfigurable device in accordance with some embodiments of the invention. The method may be executed on a personal computer under software control, for example. The process to be executed on the reconfigurable logic circuit may be defined by a dataflow graph or other computer readable description of the process. In this example, the CAM is to be implemented on the Field Programmable Gate Array (FPGA), which is a reconfigurable logic circuit. The CAM is to be used for a stream data interface. However, it will apparent to those of ordinary skill in the art that CAM's may be designed for other applications using similar techniques. Following start block 1502 in FIG. 15, a check is made at decision block 1504 to determine if the reconfigurable logic circuit has dual port RAM's or block RAM's (BRAM's). If not, as depicted by the negative branch from decision block 1504, the stream data interface block in the reconfigurable logic circuit will be created using registers.

In this case, a description of the interface is created at block 1506 and the description is output at block 1508. If the reconfigurable logic circuit has dual port RAM's or BRAM's, as depicted by the positive branch from decision block 1504, a check is made at decision block 1510 to determine if the memories can be configured to widths required for the CAM. In an exemplary embodiment, the widths required for the CAM is dependent on the number of outstanding requests on a DOOA memory subsystem. If not, as depicted by the negative branch from decision block 1510, the stream data interface block in the reconfigurable logic circuit will again be created using registers. Again, a description of the interface is created at block 1506 and the description is output at block 1508. If the dual port RAM (or BRAM) can be configured to widths required for the CAM, as depicted by the positive branch from decision block 1510, the address and data widths associated with the process to be executed on the reconfigurable logic circuit are calculated at block 1512. For port A of the dual port RAM, the data width is selected to be one and the address width is calculated as a sum of the bus width, Y say, and the number of positions, X say, required in the bus address queue. For port B of the dual port RAM, the data width is selected to be the value $2^Y$, and the address width is selected as equal to the bus width, X. The stream data interface will be created from dual port RAM in the reconfigurable logic circuit and, at block 1514, a description of the interface blocks is generated. The interface block descriptions (whether using RAM or registers) are output at block 1516. The descriptions may be used to configure a reconfigurable logic circuit (or a configurable logic circuit). The descriptions may be stored for later use, transmitted to another computer, or used directly for configuring a device.

The method for automatic configuration of a stream data interface (SDIF) described above may also be used when the memory is made up of a number of sub-blocks. For example, for a bus having width Y-bits and a bus queue of length $M \leq 2^X$ in a reconfigurable logic circuit having a plurality of dual port memories configurable in widths, the dual port memory, (i,j) say, of the plurality of dual port memories is configured to have a first port with data width one and address width $X_i+Y_j$, and a second port with address width $X_i$-bits and data width $N_j$-bits, where $N_j \leq 2^{Y_j}$. The sum of the values $Y_j$ is equal to the bus width Y, the sum of the values $X_i$ is equal to X and the sum of the values $N_j$ is equal to the number of memory locations N to be accessed. A first control module circuit is configured to be operable to select a dual port memory, (k,l) say, from the plurality of dual port memories, dependent upon an address of width Y-bits and an X-bit memory bus access tag value and further operable to generate an address of width $(X_k+Y_l)$-bits for the first port of the selected dual port memory, (k,l). A second control module circuit is configured to be operable to select at least one dual port memory dependent upon a memory bus access tag and to write zero values to the second ports at addresses determined by a memory bus access tag value. In addition, the second control module circuit is configured to be operable to read the second ports of the dual port memories at addresses determined by a memory bus access tag value.

The dual port memories may be random access memories, for example, and the reconfigurable logic circuit may be a field programmable gate array (FPGA).

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for updating a content addressable memory (CAM) comprising a memory having a first port configured to white a 1-bit data to the memory and a second port configured to access the memory to read and write N-bit data, where N is greater than one, the method comprising:
   writing an N-bit zero data word to the second port at a first address A2 to erase N bits of the memory at address A2;
   combining the first address A2 with a data value A0 to form a second address A1; and
   writing a value 1 to the first data port at the address A1, to set bit of memory at the second address A1,
wherein reading the second port at the first address A2 will produce an N-bit data word having value 1 at bit position A0 and zero at all other bit positions.

2. A method in accordance with claim 1, wherein A0 is a Y-bit value and $N \leq 2^Y$ and wherein the first port is configured to store 1-bit data at up to $2^{X+Y}$ locations addressed by an (X+Y)-bit address and the second port is configured to store $2^Y$-bit data at up to $2^X$ locations addressed by an X-bit address.

3. A method in accordance with claim 1, wherein the data value A0 comprises an external memory address and the address A2 comprises a memory bus access tag associated with a request to access an external memory at the address A0.

4. A method in accordance with claim 3, further comprising:
   reading Port B at an address B2 to retrieve an N-bit data word B3, having a value 1 in bit B0 and zeroes at all other bit positions; and
   associating the received data value with a request to access the external memory at address B0.

5. A method in accordance with claim 1, wherein the memory comprises a plurality of sub-blocks and wherein writing an N-bit zero data word to the second port at the first address A2 to erase N bits of the memory at address A2 comprises:
   selecting at least two sub-block of memory of the plurality of sub-blocks dependent upon the address A2;
   selecting an address in the least two selected sub-block of memory dependent upon the address A2; and
   writing zero to each of the least two selected sub-block at the selected address.

6. A method in accordance with claim 1, wherein the memory comprises a plurality of sub-blocks and wherein writing a value 1 to the first data port at the address A1 comprises:
   selecting at a sub-block of memory of the plurality of sub-blocks dependent upon the address A1 and the data value A0;
   selecting an address in the selected sub-block of memory dependent upon the address A1 and the data value A0; and
   writing a value 1 to the selected sub-block at the selected address.

7. A method in accordance with claim 1, wherein the memory comprises a plurality of sub-blocks, the method further comprising:
   selecting at least two sub-blocks of memory of the plurality of sub-blocks dependent upon the address A2;
   selecting an address in the least two selected sub-block of memory dependent upon the address A2;
   reading the at least two selected sub-block of memory at the selected address to obtain at least two intermediate words; and
   combining the at least two intermediate words to form an N-bit data word.

8. A method in accordance with claim 1, wherein the memories comprise random access memories in a field programmable gate array (FPGA).

9. A content addressable memory (CAM) comprising:
   a memory having a first port operable to write 1-bit data to the memory, and a second port operable to write N-bit data from the memory, where N is greater than 1, and further operable to read N-bit data from the memory; and
   a control module operable to update the N-bit data in the memory at a first address A2 by:
      writing an N-bit zero data word to the second port at the first address A2;
      combining the first address A2 with a data value A0 to form a second address A1; and
      writing a value 1 to the first data port at the second address A1, the control module further operable to search the memory by:
         reading the second port at a third address B2 to retrieve a N-bit data value B3;
         associating the value B0 with the value B2 if the value B3 has value 1 at bit position B0 and zeros at all other bit positions; and
         determining the value B2 to be unmatched if the value B3 has value 0 at all bit positions.

10. A content addressable memory in accordance with claim 9, wherein A0 is a Y-bit value and $N \leq 2^Y$ and wherein the first port is configured to store 1-bit data at up to $2^{X+Y}$ locations addressed by an (X+Y)-bit address and the second port is configured to store N-bit data at up to $2^X$ locations addressed by an X-bit address.

11. A content addressable memory in accordance with claim 9, wherein the memory comprises a plurality of sub-blocks of memory each operable to stored data of width less than N-bits, and wherein writing an N-bit zero data word to the second port at the first address A2 comprises writing zero data to each of the plurality of sub-blocks of memory at the first address A2.

12. A content addressable memory in accordance with claim 9, wherein the memory comprises a plurality of sub-blocks of memory each operable to stored data of width N-bits, and wherein writing an N-bit zero data word to the second port at the first address A2 comprises:
   selecting a sub-block of memory of the plurality of sub-blocks of memory dependent upon the address A2;
   selecting an address in the selected sub-block of memory dependent upon the address A2; and
   writing zero to the selected sub-block of memory at the selected address.

13. A content addressable memory in accordance with claim 9, wherein the memory comprises a plurality of sub-blocks of memory and wherein writing a value 1 to the first data port at the second address A1 comprises:
   selecting a cub-block of memory of the plurality of sub-blocks of memory dependent upon the address A1;

selecting an address in the selected sub-block of memory dependent upon the address A1; and writing a value 1 to the selected sub-block of memory at the selected address.

14. A content addressable memory in accordance with claim 9, wherein the memory comprises at least one block Random Access Memory (RAM).

15. A content addressable memory in accordance with claim 9, wherein the control module comprises a reconfigurable logic circuit.

16. A content addressable memory in accordance with claim 9, wherein the control module comprises a Field Programmable Gate Array (FPGA).

* * * * *

UNITED STATES PATENT AND TRADEMARK OFFICE
CERTIFICATE OF CORRECTION

PATENT NO. : 7,483,283 B2
APPLICATION NO. : 11/694401
DATED : January 27, 2009
INVENTOR(S) : Linda M. Dawson et al.

It is certified that error appears in the above-identified patent and that said Letters Patent is hereby corrected as shown below:

ON THE TITLE PAGE

On the Face Page, in Field (56), under "OTHER PUBLICATIONS", in Column 2, Line 1, delete "arm," and insert -- ARM, --, therefor.

IN THE CLAIMS

In Column 13, Line 16, in Claim 1, delete "white" and insert -- write --, therefor.

In Column 13, Line 24, in Claim 1, delete "set bit" and insert -- set one bit --, therefor.

In Column 13, Line 27, in Claim 1, delete "zero" and insert -- zeroes --, therefor.

In Column 14, Line 19, in Claim 9, delete "from" and insert -- to --, therefor.

In Column 14, Line 46, in Claim 11, delete "stored" and insert -- store --, therefor.

In Column 14, Line 53, in Claim 12, delete "stored" and insert -- store --, therefor.

In Column 14, Line 66, in Claim 13, delete "cub" and insert -- sub --, therefor.

Signed and Sealed this

Eighteenth Day of August, 2009

David J. Kappos
*Director of the United States Patent and Trademark Office*